US009331115B2

(12) United States Patent
Li et al.

(10) Patent No.: US 9,331,115 B2
(45) Date of Patent: May 3, 2016

(54) IMAGE SENSOR HAVING A GAPLESS MICROLENSES

(71) Applicant: OMNIVISION TECHNOLOGIES, INC., Santa Clara, CA (US)

(72) Inventors: Jin Li, San Jose, CA (US); Yin Qian, Milpitas, CA (US); Gang Chen, San Jose, CA (US); Dyson H. Tai, San Jose, CA (US); Dajiang Yang, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 8 days.

(21) Appl. No.: 14/222,833

(22) Filed: Mar. 24, 2014

(65) Prior Publication Data

US 2015/0270302 A1 Sep. 24, 2015

(51) Int. Cl.
| | |
|---|---|
| *H04N 9/73* | (2006.01) |
| *H04N 9/04* | (2006.01) |
| *H04N 9/87* | (2006.01) |
| *H01L 27/146* | (2006.01) |
| *G02B 13/00* | (2006.01) |

(52) U.S. Cl.
CPC ...... *H01L 27/14627* (2013.01); *G02B 13/0015* (2013.01); *H01L 27/14643* (2013.01)

(58) Field of Classification Search
None
See application file for complete search history.

(56) References Cited

U.S. PATENT DOCUMENTS

| 2006/0027887 A1* | 2/2006 | Boettiger et al. | 257/432 |
| 2012/0092747 A1* | 4/2012 | Martin et al. | 359/290 |

OTHER PUBLICATIONS

TW Application No. 103129084—Taiwanese Office Action and Search Report, with English Translation, issued Jan. 20, 2016 (14 pages).

* cited by examiner

*Primary Examiner* — Aung S Moe
*Assistant Examiner* — Euel Cowan
(74) *Attorney, Agent, or Firm* — Blakely Sokoloff Taylor & Zafman LLP

(57) ABSTRACT

An image sensor includes a plurality of photosensitive devices arranged in a semiconductor substrate. A planar layer is disposed over the plurality of photosensitive devices in the semiconductor substrate. A plurality of first microlenses comprised of a lens material is arranged in first lens regions on the planar layer. A plurality of lens barriers comprised of the lens material is arranged on the planar layer to provide boundaries that define second lens regions on the planar layer. A plurality of second microlenses comprised of the lens material is formed within the boundaries provided by the plurality of lens barriers that define the second lens regions on the planar layer. The plurality of lens barriers are integrated with respective second microlenses after a reflow process of the plurality of second microlenses.

19 Claims, 6 Drawing Sheets

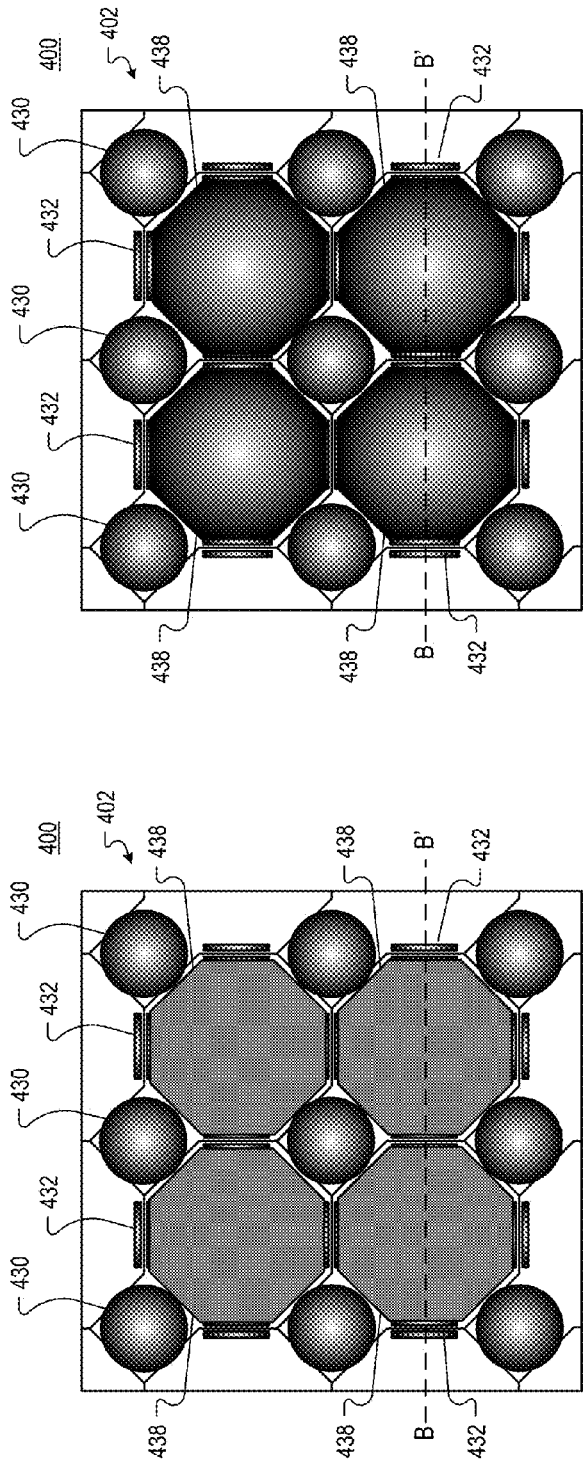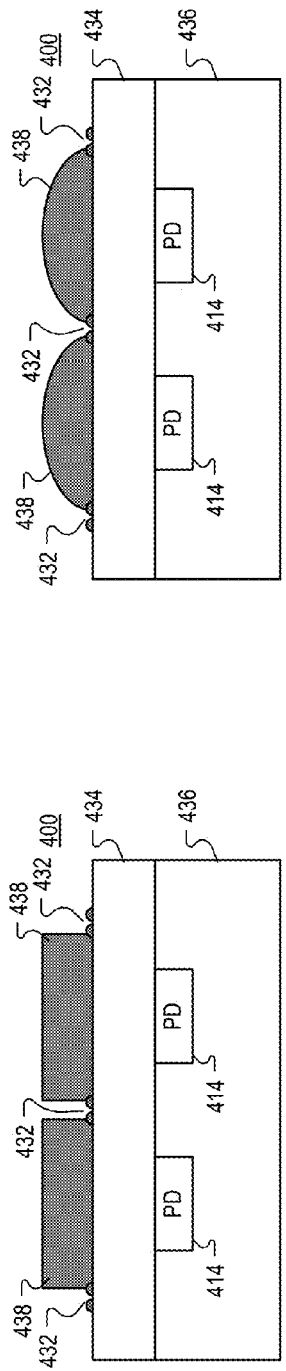
FIG. 4E  FIG. 4F  FIG. 4G  FIG. 4H

IMAGE SENSOR HAVING A GAPLESS MICROLENSES

BACKGROUND INFORMATION

1. Field of the Disclosure

The present invention relates generally to imaging, and more specifically, the present invention is directed to high dynamic range image sensors having gapless microlenses.

2. Background

Image sensors have become ubiquitous. They are widely used in digital still cameras, cellular phones, security cameras, as well as, medical, automobile, and other applications. The technology used to manufacture image sensors, such as for example complementary metal-oxide-semiconductor (CMOS) image sensors (CIS), has continued to advance at a great pace. For example, the demands for higher resolution and lower power consumption have encouraged the further miniaturization and integration of these image sensors.

High dynamic range (HDR) image sensors have become useful for many applications. In general, ordinary image sensors, including for example charge coupled device (CCD) and CMOS image sensors, have a dynamic range of approximately 70 dB dynamic range. In comparison, the human eye has a dynamic range of up to approximately 100 dB. There are a variety of situation in which an image sensor having an increased dynamic range is beneficial. For example, image sensors having a dynamic range of more than 100 dB dynamic range are needed in the automotive industry in order to handle different driving conditions, such as driving from a dark tunnel into bright sunlight. Indeed, many applications may require image sensors with at least 90 dB of dynamic range or more to accommodate a wide range of lighting situations, varying from low light conditions to bright light conditions.

One of the challenges with providing miniaturized higher resolution image sensors is that the gap distances between the microlenses in known image sensors limit the density of the microlenses in the image sensor. Indeed, as the gaps between lenses become smaller, there is an increased risk of neighboring microlenses merging together during the reflow process, which reduces yields. As a consequence, maintaining minimum gap distances between microlenses have resulted in reduced fill factors and lower quantum efficiencies in known images sensors.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 4E illustrates a top down view of another example of a plurality of second microlenses that are patterned in an example image sensor after the first plurality of microlenses and the plurality of lens barriers have been reflowed in accordance with the teachings of the present invention.

FIG. 4F illustrates a cross-section view of the example of the plurality of second microlenses and the plurality of lens barriers that are patterned in an example image sensor in accordance with the teachings of the present invention.

FIG. 4G illustrates a top down view of the example of the plurality of second microlenses and the plurality of lens barriers after a second reflow process of an example image sensor in accordance with the teachings of the present invention.

FIG. 4H illustrates a cross-section view of the example of the plurality of second microlenses and the plurality of lens barriers after the second reflow process of an example image sensor in accordance with the teachings of the present invention.

Figure 1:
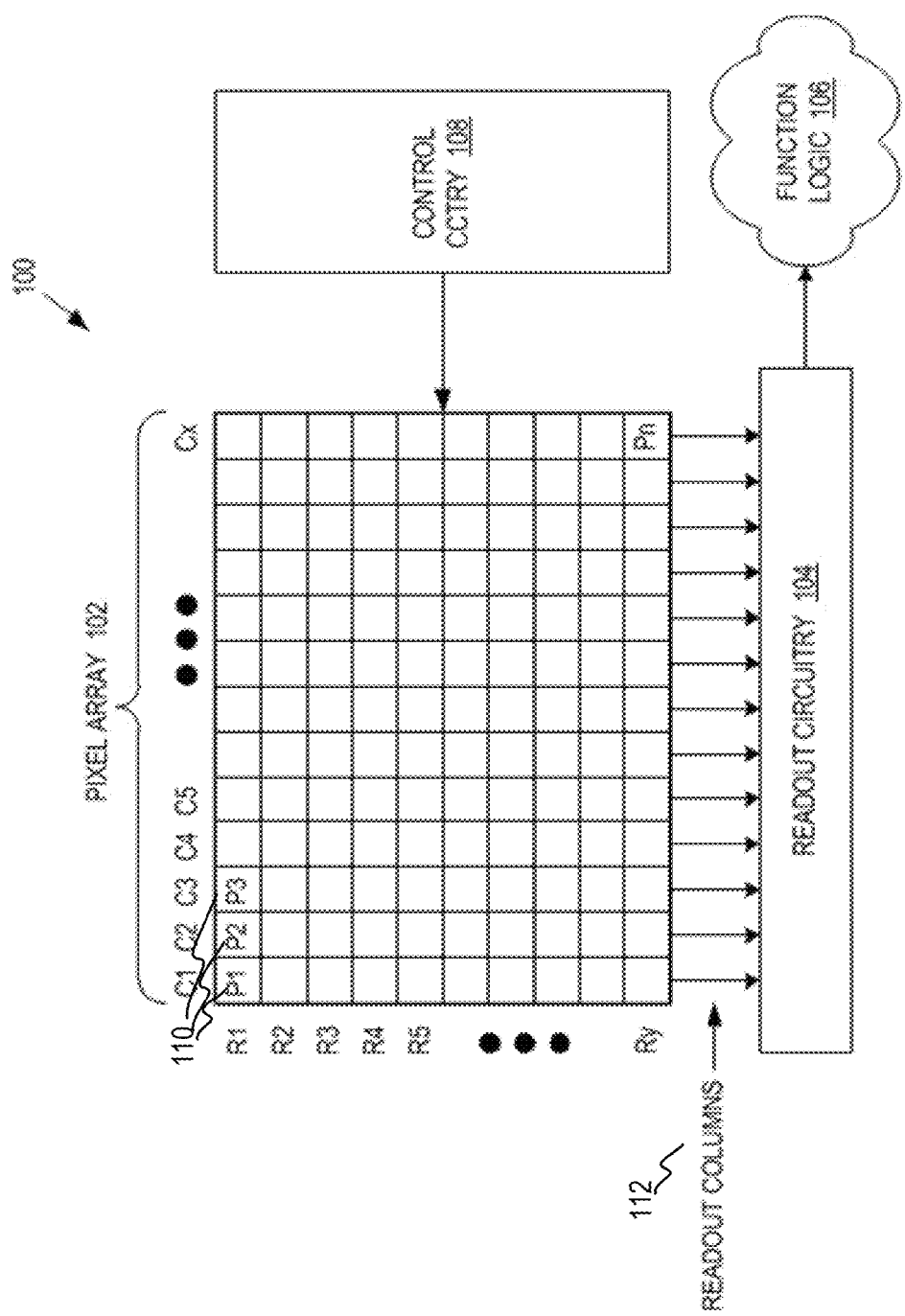
FIG. 1 is a diagram illustrating one example of an imaging system including an example HDR image sensor with gapless microlenses in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Examples in accordance with the teaching of the present invention describe an image sensor with a plurality of gapless microlenses. With the gapless microlenses provided in accordance with the teachings of the present invention, fill factors are increased and improved quantum efficiencies are provided with example images sensors in accordance with the teachings of the present invention. In the various examples provided for explanation purposes, the image sensor is an HDR image sensor including a first plurality of microlenses optically coupled to short integration photosensitive devices and a second plurality of microlenses optically coupled to long integration photosensitive devices of the image sensor. As will be described in various examples, a plurality of lens barriers made of lens material are arranged on a planar layer of the image sensor to provide boundaries that define second lens regions on the planar layer to provide the gapless microlenses in accordance with the teachings of the present invention.

To illustrate, FIG. 1 is a diagram that shows generally one example of an HDR imaging system 100 including an example pixel array 102 having pixels 110 in accordance with the teachings of the present invention. In one example, the pixels 110 may be HDR pixels that that include at least a short integration photosensitive device and a long integration photosensitive device. In one example, the short integration photosensitive device of each pixel has a smaller light exposure area and a higher overall doping concentration compared to the long integration photosensitive device of the pixel. Correspondingly, in the depicted example, a first plurality of microlenses that are optically coupled to the short integration photosensitive devices have a smaller area than a second plurality of microlenses that are optically coupled to the long integration photosensitive devices in accordance with the teachings of the present invention.

In one example, a plurality of lens barriers made of the same lens material as the first and second pluralities of microlenses are also arranged on a planar layer of the image sensor to provide boundaries that define second lens regions on the planar layer to provide gapless microlenses in accordance with the teachings of the present invention. As shown in the depicted example, HDR imaging system 100 includes pixel array 102 coupled to control circuitry 108 and readout circuitry 104, which is coupled to function logic 106.

In one example, pixel array 102 is a two-dimensional (2D) array of imaging sensors or pixels 110 (e.g., pixels P1, P2 . . . , Pn). In one example, each pixel 110 is a CMOS imaging pixel including at least a short integration photosensitive device and a long integration photosensitive device. As illustrated, each pixel 110 is arranged into a row (e.g., rows R1 to Ry) and a column (e.g., column C1 to Cx) to acquire image data of a person, place, object, etc., which can then be used to render an image of the person, place, object, etc.

In one example, after each pixel 110 has acquired its image data or image charge, the image data is read out by readout circuitry 104 through readout columns 112 and then transferred to function logic 106. In various examples, readout circuitry 104 may include amplification circuitry, analog-to-digital (ADC) conversion circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may read out a row of image data at a time along readout column lines (illustrated) or may read out the image data using a variety of other techniques (not illustrated), such as a serial read out or a full parallel read out of all pixels simultaneously.

In one example, control circuitry 108 is coupled to pixel array 102 to control operational characteristics of pixel array 102. For example, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows.

Figure 2:
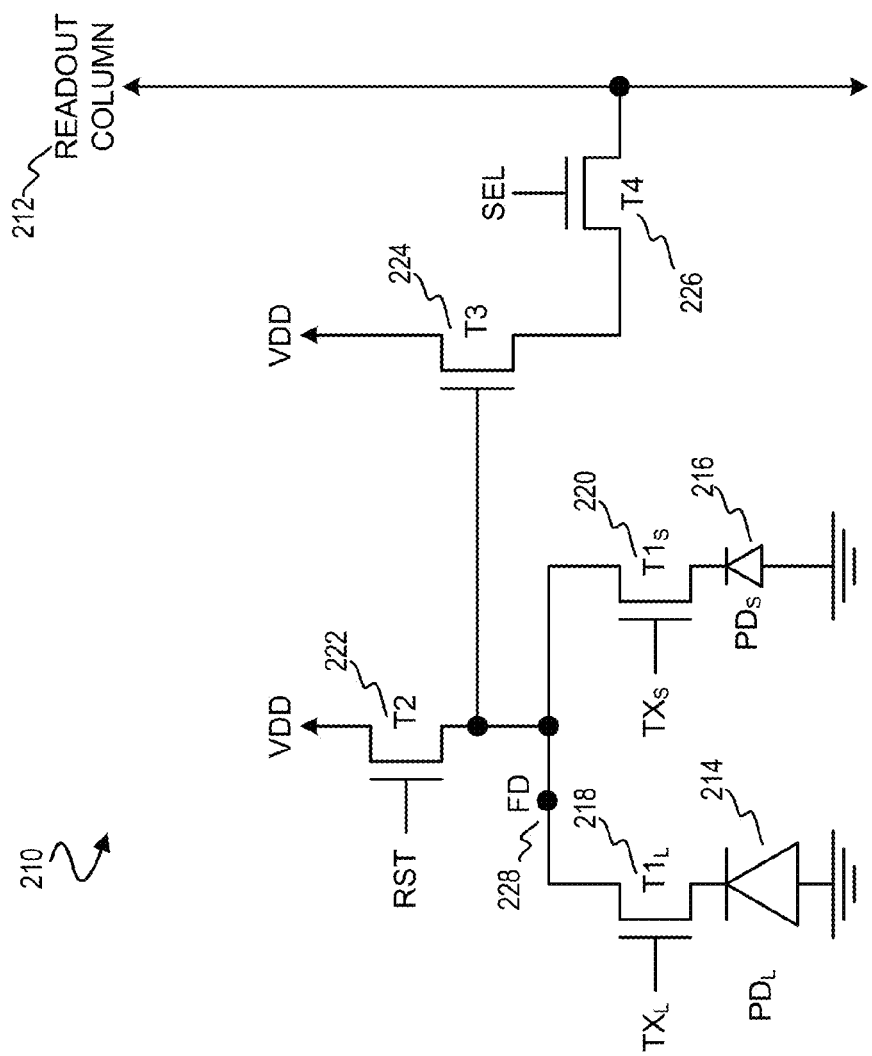
FIG. 2 is a schematic illustrating one example of HDR pixel circuitry of an image sensor including a plurality of photosensitive devices in accordance with the teachings of the present invention.

FIG. 2 is a schematic illustrating one example of a pixel 210 in accordance with the teachings of the present invention. In one example, it is appreciated that pixel 210 may be one of the plurality of pixels 110 included in the example pixel array 102 of the HDR image sensor 100 illustrated above in FIG. 1. It is appreciated that pixel 210 is provided for explanation purposes and therefore represents just one possible architecture for implementing each pixel within pixel array 102 of FIG. 1, and that examples in accordance with the teachings of the present invention are not limited to specific pixel architectures. Indeed, one of ordinary skill in the art having the benefit of the instant disclosure will understand that the present teachings are applicable to 3T, 4T, 5T designs, as well as various other suitable pixel architectures in accordance with the teachings of the present invention.

As shown in the example depicted in FIG. 2, pixel 210 includes a short integration photosensitive device $PD_S$ 216 and a long integration photosensitive device $PD_L$ 214. In one example, the long integration photosensitive device $PD_L$ 214 has a larger light exposure area than the light exposure area of short integration photosensitive device $PD_S$ 216. Thus, the microlens optically coupled to long integration photosensitive device PD$_L$ 214 correspondingly has a larger area than the area of the microlens that is optically coupled to the short integration photosensitive device. In the example, the long integration photosensitive device PD$_L$ 214 has higher sensitivity to incident light and is therefore utilized for lower light intensity sensing. Since short integration photosensitive device PD$_S$ 216 on the other hand has less light exposure area, it is less sensitive to light compared to long integration photosensitive device PD$_L$ 214, and is therefore utilized for higher light intensity sensing. By utilizing both long integration photosensitive device PD$_L$ 214 and short integration photosensitive device PD$_S$ 216 in pixel 210, HDR imaging sensing is realized.

Continuing with the example depicted in FIG. 2, charge that is accumulated in long integration photosensitive device PD$_L$ 214 is switched through transfer transistor T1$_L$ 218 to a floating drain FD 228 in response to a control signal TX$_L$ and charge that is accumulated in short integration photosensitive device PD$_S$ 216 is switched through transfer transistor T1$_S$ 220 to floating drain FD 228 in response to a control signal TX$_S$.

As shown in the example, pixel 210 also includes an amplifier transistor T3 224 that has a gate terminal coupled to floating drain FD 228. Thus, in the illustrated example, the charge from long integration photosensitive device PD$_L$ 214 and short integration photosensitive device PD$_S$ 216 are separately switched to floating drain FD 228, which is coupled to amplifier transistor T3 224. In one example, amplifier transistor T3 224 is coupled in a source follower configuration as shown, which therefore amplifies an input signal at the gate terminal of amplifier transistor T3 224 to an output signal at the source terminal of amplifier transistor T3 224. As shown, row select transistor T4 226 is coupled to the source terminal of amplifier transistor T3 224 to selectively switch the output of amplifier transistor T3 224 to readout column 212 in response to a control signal SEL. As shown in the example, pixel 210 also includes reset transistor T2 222 coupled to floating drain FD 228, long integration photosensitive device PD$_L$ 214 and short integration photosensitive device PD$_S$ 216, which may be used to reset charge accumulated in pixel 210 in response to a reset signal RST. In one example, the charge accumulated in floating drain FD 228, long integration photosensitive device PD$_L$ 214 and short integration photosensitive device PD$_S$ 216 can be reset during an initialization period of pixel 210, or for example each time after charge information has been read out from pixel 210 and prior to accumulating charge in long integration photosensitive device PD$_L$ 214 and short integration photosensitive device PD$_S$ 216 for the acquisition of a new HDR image in accordance with the teachings of the present invention.

Figures 3A, 3B, 3C, 3D:
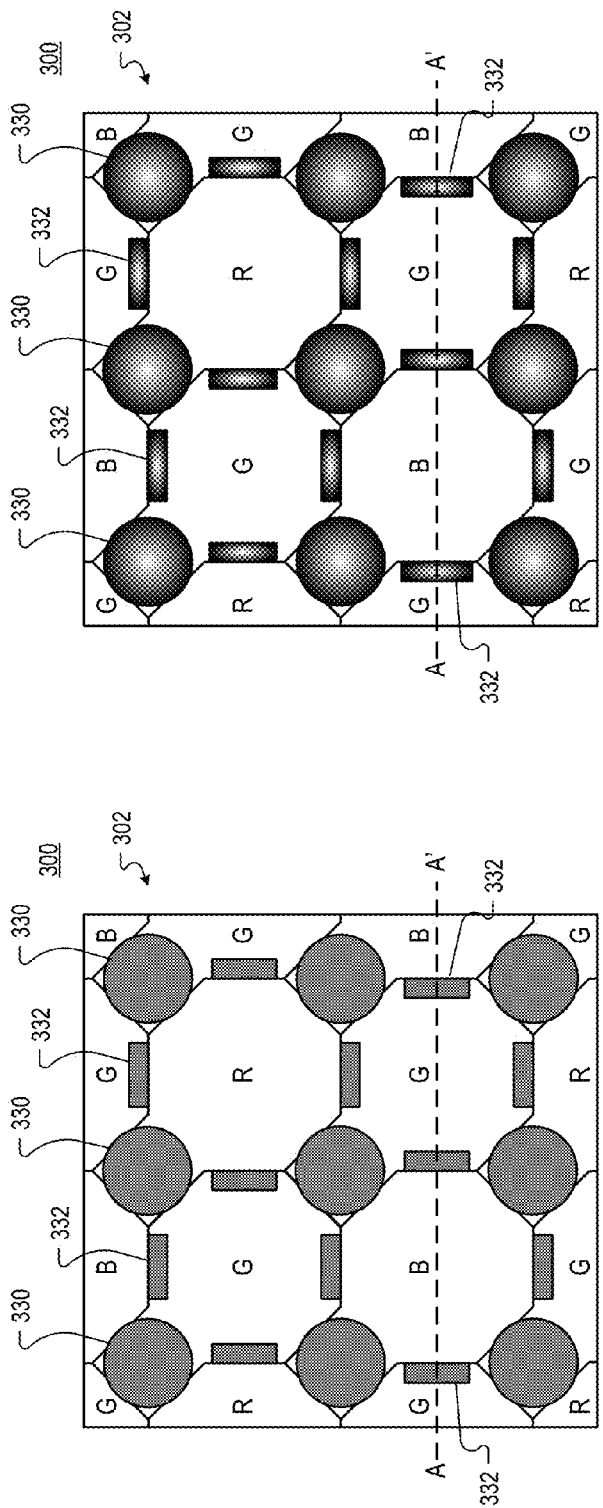
FIG. 3A illustrates a top down view of one example of a plurality of first microlenses and a plurality of lens barriers that are patterned in an example image sensor in accordance with the teachings of the present invention.
FIG. 3B illustrates a cross-section view of the example of the plurality of lens barriers that are patterned in an example image sensor in accordance with the teachings of the present invention.
FIG. 3C illustrates a top down view of the example of the plurality of first microlenses and the plurality of lens barriers after a first reflow process of an example image sensor in accordance with the teachings of the present invention.
FIG. 3D illustrates a cross-section view of the example of the plurality of lens barriers after the first reflow process of an example image sensor in accordance with the teachings of the present invention.

FIG. 3A illustrates a top down view of one example of a plurality of first microlenses 330 and a plurality of lens barriers 332 that are patterned in an example image sensor 300 in accordance with the teachings of the present invention. In the depicted example, it is noted that the pixel array 302 of image sensor 300 is arranged in a Bayer pattern. As shown, the Bayer pattern uses a checkerboard pattern with alternating rows of color filters. The Bayer pattern has twice as many green (G) pixels as red (R) or blue (B) pixels, and they are arranged in alternating rows of red (R) wedged between greens (G), and of blue (B) wedged between greens (G). This pattern takes advantage of the human eye's predilection to see green luminance as the strongest influence in defining sharpness. What's more, the Bayer pattern produces identical images regardless of how you hold the camera—in landscape or portrait mode.

As shown in the example depicted in FIG. 3A, a first plurality of microlenses 330 is arranged in first lens regions over a planar layer of the image sensor 300. In the example, each one of the plurality of microlenses 330 is optically coupled through the underlying planar layer to a corresponding photosensitive device arranged in an underlying semiconductor substrate of image sensor 300. The example depicted in FIG. 3A also illustrates that there is also a plurality of lens barriers 332 arranged on the planar layer as shown. In the example, the plurality of lens barriers 332 is made of the same lens material having the same index of refraction as the first plurality of microlenses 330. In one example, the first plurality of microlenses 330 and plurality of lens barriers 332 have a different index of refraction than the planar layer on which they are patterned. As will be discussed, the plurality of lens barriers 332 is arranged on the planar layer to provide boundaries that define second lens regions on the planar layer in accordance with the teachings of the present invention. In various examples, the lens material utilized in image sensor 300 may be formed from polymer-based materials or the like. As shown in the example illustrated in FIG. 3A, the plurality of lens barriers 332 are arranged proximate to boundaries defined between two second lens regions on the planar layer.

For instance, FIG. 3A shows that the plurality of lens barriers 332 are arranged within the green (G) second lens regions proximate to the boundaries to the neighboring red (R) and blue (B) second lens regions. It is appreciated of course the example illustrated in FIG. 3A is provided for illustration purposes and that the plurality of lens barriers 332 could be arranged in the red (R) and blue (B) second lens regions proximate to their respective boundaries with the green (G) second lens regions in accordance with the teachings of the present invention.

FIG. 3B illustrates a cross-section view of the example image sensor 300 illustrated in FIG. 3A along dashed line A-A'. Accordingly, similarly named and numbered elements referenced below are coupled and function similar to as described above. As shown in the cross-section example depicted in FIG. 3B, a plurality of lens barriers 332 is arranged and patterned on a planar layer 334 as shown in accordance with the teachings of the present invention. As shown, the planar layer 334 is disposed over a semiconductor substrate 336 in which a plurality of photosensitive devices 314 is arranged. In the example, the photosensitive devices 314 may be examples of the photosensitive devices included in pixels 110 or 210 discussed above in FIGS. 1-2. Continuing with the example shown in FIG. 3B, the plurality of lens barriers 332 is arranged on the planar layer 334 to provide boundaries that define second lens regions on the planar layer in accordance with the teachings of the present invention.

In various examples, it is appreciated that planar layer 334 may include one or more layers of image sensor 300. For instance, in one example, planar layer 334 may include one or more spacer layers as well as a color filter array layer having various combinations of red, green, blue, cyan, magenta, yellow, clear, or other suitable filters in accordance with the teachings of the present invention.

FIG. 3C illustrates a top down view of the example image sensor 300 illustrated in FIGS. 3A-B after a first reflow process in accordance with the teachings of the present invention. Accordingly, similarly named and numbered elements referenced below are coupled and function similar to as described above. As shown the depicted example, the first reflow process allows the surface tension in the first plurality of microlenses 330 and the plurality of lens barriers 332 to cause the individual pieces of the lens material of the first plurality of microlenses 330 and the plurality of lens barriers 332 to dome and form curvatures.

To illustrate, FIG. 3D illustrates a cross-section view of the example image sensor 300 after the first reflow process as illustrated in FIG. 3C along dashed line A-A'. Accordingly, similarly named and numbered elements referenced below are coupled and function similar to as described above. As shown in the example depicted in FIG. 3D, the first reflow process allows the surface tension in the plurality of lens barriers 332 to cause the individual pieces of the lens material of the plurality of lens barriers 332 to dome and form curvatures.

Figure 3E:
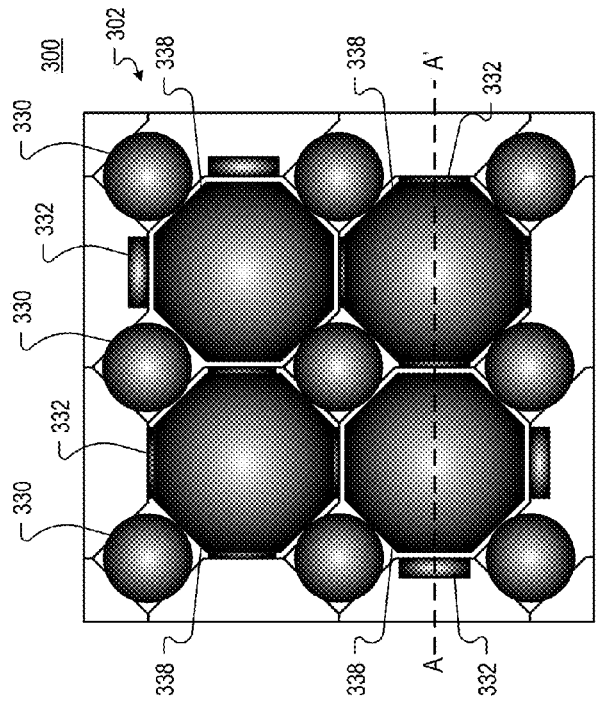
FIG. 3E illustrates a top down view of the example of a plurality of second microlenses that are patterned in an example image sensor after the first plurality of microlenses and the plurality of lens barriers have been reflowed in accordance with the teachings of the present invention.

FIG. 3E illustrates a top down view of one example of a plurality of second microlenses 338 that is patterned in the example image sensor 300 after the first plurality of microlenses 330 and the plurality of lens barriers 332 have been reflowed as illustrated above in FIGS. 3C-3D in accordance with the teachings of the present invention. Accordingly, similarly named and numbered elements referenced below are coupled and function similar to as described above. As shown in the example depicted in FIG. 3E, the second plurality of microlenses 338 is arranged in the second lens regions defined by the boundaries provided by the plurality of lens barriers 332 over the planar layer 334 of the image sensor 300. In the example, each one of the second plurality of microlenses 338 is optically coupled through the underlying planar layer 334 to a corresponding photosensitive device 314 arranged in the underlying semiconductor substrate 336 of image sensor 330. In the example, the second plurality of microlenses 338 is made of the same lens material having the same index of refraction as the first plurality of microlenses 330 and the plurality of lens barriers 332. In one example, the second plurality of microlenses 338 therefore also has a different index of refraction than the planar layer 334 on which the second plurality of microlenses 338 is patterned. In the example illustrated in FIG. 3E, the second plurality of microlenses 338 that are arranged in the green (G) second lens regions are in contact with their respective lens barriers 332, while the second plurality of microlenses 338 that are arranged in the red (R) and blue (B) second lens regions are not in contact with the lens barriers 332, which are in the green (G) second lens regions in the example shown in FIG. 3E.

Figure 3F:
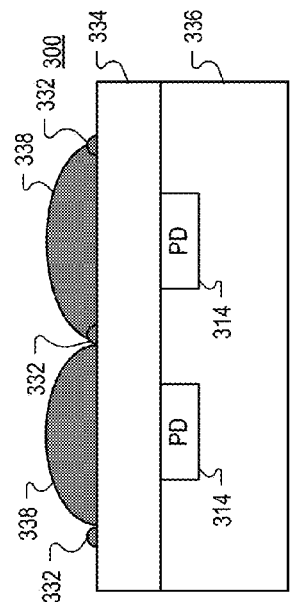
FIG. 3F illustrates a cross-section view of the example of the plurality of second microlenses and the plurality of lens barriers that are patterned in an example image sensor in accordance with the teachings of the present invention.

FIG. 3F illustrates a cross-section view of the example image sensor 300 illustrated in FIG. 3E along dashed line A-A'. Accordingly, similarly named and numbered elements referenced below are coupled and function similar to as described above. As shown in the cross-section example depicted in FIG. 3F, the plurality of second microlenses 338 is arranged on the planar layer 334 in the second lens regions, which are proximate to the plurality of lens barriers 332 as shown in accordance with the teachings of the present invention. As shown, the planar layer 334 is disposed over a semiconductor substrate 336 in which a plurality of photosensitive devices 314 is arranged. In the example, each one of the plurality of second microlenses 338 is also optically coupled through the planar layer 334 to a corresponding one of the photosensitive devices 314 in the semiconductor substrate 336.

Figure 3G:
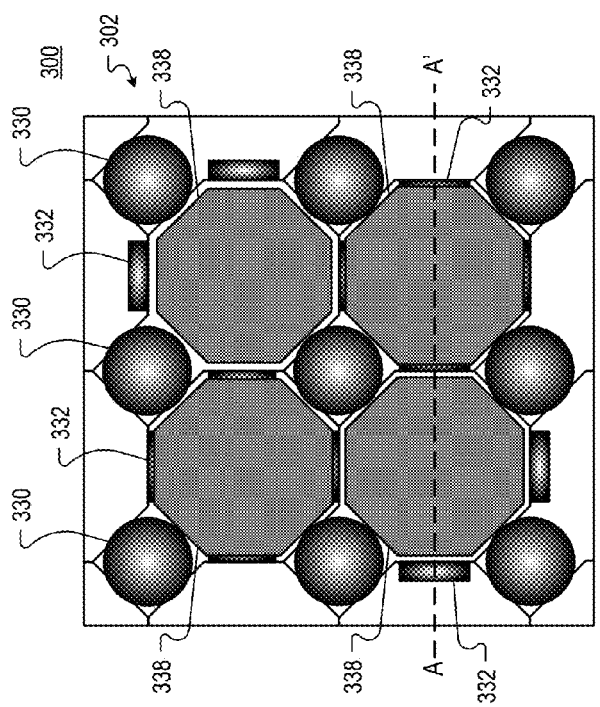
FIG. 3G illustrates a top down view of the example of the plurality of second microlenses and the plurality of lens barriers after a second reflow process of an example image sensor in accordance with the teachings of the present invention.

FIG. 3G illustrates a top down view of the example image sensor 300 illustrated in FIGS. 3A-F after a second reflow process, which occurs after the first reflow process, in accordance with the teachings of the present invention. Accordingly, similarly named and numbered elements referenced below are coupled and function similar to as described above. In the illustrated example, the second plurality of microlenses 338 are reflowed during the second reflow process as shown. As shown in the example depicted in FIG. 3G, the second reflow process allows the surface tension in the second plurality of microlenses 338 to cause the individual pieces of the lens material of the second plurality of microlenses 338 to dome and form curvatures. As shown in the example in FIG. 3G, the each one of the plurality of lens barriers 332 are arranged proximate to the respective boundaries, which are defined between two of the second plurality of microlenses 338 on the planar layer 334 in accordance with the teachings of the present invention.

Figure 3H:
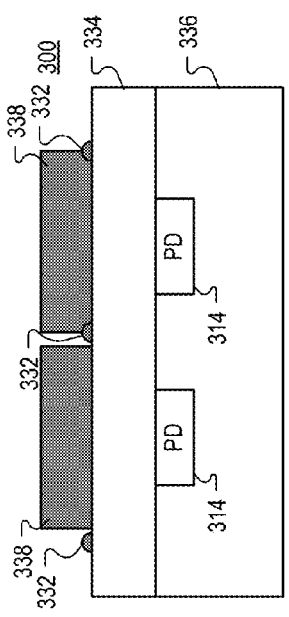
FIG. 3H illustrates a cross-section view of the example of the plurality of second microlenses and the plurality of lens barriers after the second reflow process of an example image sensor in accordance with the teachings of the present invention.

To illustrate, FIG. 3H illustrates a cross-section view of the example image sensor 300 after the second reflow process as illustrated in FIG. 3G along dashed line A-A'. Accordingly, similarly named and numbered elements referenced below are coupled and function similar to as described above. As shown in the example depicted in FIG. 3H, the second reflow process allows the surface tension in the lens material of the second plurality of microlenses 338 to dome and form curvatures. In the example, each of the lens barriers 332 becomes integrated with their respective microlenses 338 as shown. Indeed, as discussed in one example, the lens barriers 332 and the microlenses are made of the same lens material and have the same index of refraction such that the lens barriers 332 become fully integrated within their respective microlenses 338 after the second reflow process in accordance with the teachings of the present invention.

As shown, the plurality of lens barriers 332, which in the example depicted in FIG. 3H are arranged within the green (G) second lens regions proximate to the boundaries to the neighboring red (R) and blue (B) second lens regions, provide boundaries such that when the second plurality of microlenses 338 are reflowed in response to the second reflow process, the plurality of lens barriers 332 prevent the lens material from neighboring microlenses 338 from merging with each other. Therefore, since the lens material of microlenses 338 are prevented from merging together with the plurality of lens barriers 332, the previously required minimum gap distances between the second plurality of microlenses 338 are no longer necessary. Accordingly, an image sensor 300 with gapless or nearly gapless microlenses is provided in accordance with the teachings of the present invention. With the gapless or nearly gapless microlenses as shown in the depicted example, the fill factor of image sensor 300 is increased, which also improves quantum efficiency of image sensor 300 in accordance with the teachings of the present invention.

Figure 4A:
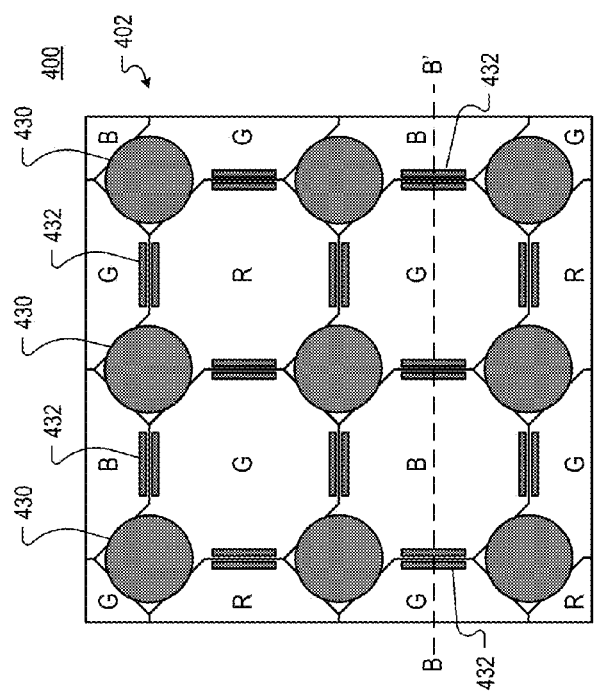
FIG. 4A illustrates a top down view of another example of a plurality of first microlenses and a plurality of lens barriers that are patterned in an example image sensor in accordance with the teachings of the present invention.

FIG. 4A illustrates a top down view of another example of a plurality of first microlenses 430 and a plurality of lens barriers 432 that are patterned in an example image sensor 400 in accordance with the teachings of the present invention. In the depicted example, it is noted that the pixel array 402 of image sensor 400 is arranged in a Bayer pattern. As can be observed, it is noted that image sensor 400 shown in FIG. 4A shares many similarities with image sensor 300 described above in FIGS. 3A-3H. Accordingly, similarly named and numbered elements referenced below are coupled and function similar to as described above. One difference between image sensor 400 of FIG. 4A and image sensor 300 of FIGS. 3A-3H is that the plurality of lens barriers 432 are arranged in pairs on a planar layer of image sensor 400 as shown, and will be discussed in further detail below.

Continuing with the example depicted in FIG. 4A, a first plurality of microlenses 430 is arranged in first lens regions over a planar layer of the image sensor 400. In the example, each one of the plurality of microlenses 430 is optically coupled through the underlying planar layer to a corresponding photosensitive device arranged in an underlying semiconductor substrate of image sensor 400. The example depicted in FIG. 4A also illustrates the plurality of lens barriers 432 arranged in pairs on the planar layer as shown. In the example, the plurality of lens barriers 432 are made of the same lens material having the same index of refraction as the first plurality of microlenses 430. In one example, the first plurality of microlenses 430 and plurality of lens barriers 432 have a different index of refraction than the planar layer on which they are patterned. As will be discussed, the plurality of lens barriers 432 are arranged in pairs on the planar layer to provide boundaries that define second lens regions on the planar layer in accordance with the teachings of the present invention. In various examples, the lens material utilized in image sensor 400 may be formed from polymer-based materials or the like. As shown in the example illustrated in FIG. 4A, the plurality of lens barriers 432 are arranged proximate to boundaries defined between two second lens regions on the planar layer.

Figure 4B:
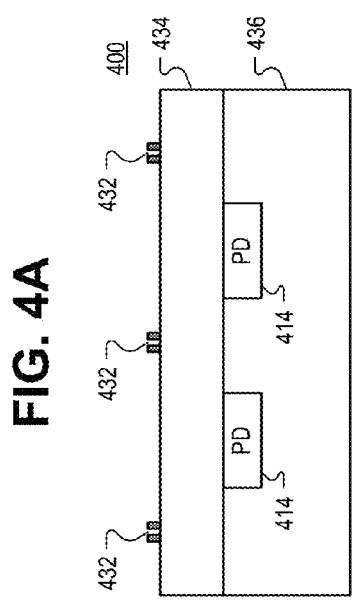
FIG. 4B illustrates a cross-section view of the example of the plurality of lens barriers that are patterned in an example image sensor in accordance with the teachings of the present invention.

FIG. 4B illustrates a cross-section view of the example image sensor 400 illustrated in FIG. 4A along dashed line B-B'. Accordingly, similarly named and numbered elements referenced below are coupled and function similar to as described above. As shown in the cross-section example depicted in FIG. 4B, a plurality of lens barriers 432 is arranged in pairs and patterned on a planar layer 434 as shown in accordance with the teachings of the present invention. As shown, the planar layer 434 is disposed over a semiconductor substrate 436 in which a plurality of photosensitive devices 414 is arranged. In the example, the photosensitive devices 414 may be examples of the photosensitive devices included in pixels 110 or 210 discussed above in FIGS. 1-2. Continuing with the example shown in FIG. 4B, each one of the plurality of lens barriers 432 is arranged in a pair on the planar layer 434 to provide boundaries that define second lens regions on the planar layer in accordance with the teachings of the present invention.

In various examples, it is appreciated that planar layer 434 may include one or more layers of image sensor 400. For instance, in one example, planar layer 434 may include one or more spacer layers as well as a color filter array layer having various combinations of red, green, blue, cyan, magenta, yellow, clear, or other suitable filters in accordance with the teachings of the present invention.

Figure 4C:
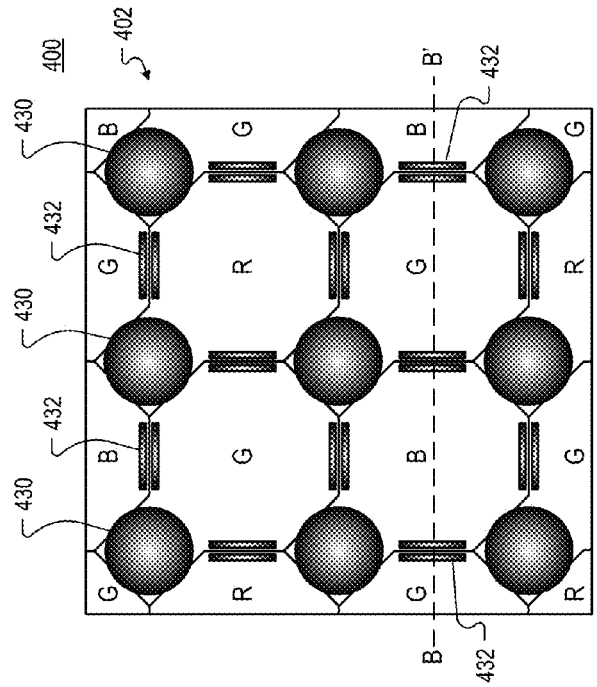
FIG. 4C illustrates a top down view of the example of the plurality of first microlenses and the plurality of lens barriers after a first reflow process of an example image sensor in accordance with the teachings of the present invention.

FIG. 4C illustrates a top down view of the example image sensor 400 illustrated in FIGS. 4A-B after a first reflow process in accordance with the teachings of the present invention. Accordingly, similarly named and numbered elements referenced below are coupled and function similar to as described above. As shown the depicted example, the first reflow process allows the surface tension in the first plurality of microlenses 430 and the plurality of lens barriers 432 to cause the individual pieces of the lens material of the first plurality of microlenses 430 and the plurality of lens barriers 432 to dome and form curvatures.

Figure 4D:
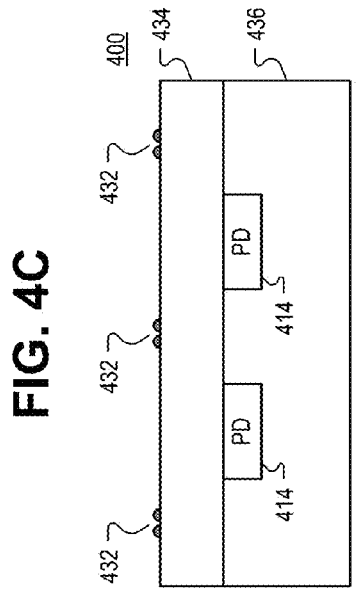
FIG. 4D illustrates a cross-section view of the example of the plurality of lens barriers after the first reflow process of an example image sensor in accordance with the teachings of the present invention.

To illustrate, FIG. 4D illustrates a cross-section view of the example image sensor 400 after the first reflow process as illustrated in FIG. 4C along dashed line B-B'. Accordingly, similarly named and numbered elements referenced below are coupled and function similar to as described above. As shown in the example depicted in FIG. 4D, the first reflow process allows the surface tension in the plurality of lens barriers 432 to cause the individual pieces of the lens material of the plurality of lens barriers 432 to dome and form curvatures.

FIG. 4E illustrates a top down view of one example of a plurality of second microlenses 438 that is patterned in the example image sensor 400 after the first plurality of microlenses 430 and the plurality of lens barriers 432 have been reflowed as illustrated above in FIGS. 4C-4D in accordance with the teachings of the present invention. Accordingly, similarly named and numbered elements referenced below are coupled and function similar to as described above. As shown in the example depicted in FIG. 4E, the second plurality of microlenses 438 is arranged in the second lens regions defined by the boundaries provided by the plurality of lens barriers 432 over the planar layer 434 of the image sensor 400. In the example, each one of the second plurality of microlenses 438 is optically coupled through the underlying planar layer 434 to a corresponding photosensitive device 414 arranged in the underlying semiconductor substrate 436 of image sensor 400. In the example, the second plurality of microlenses 438 is made of the same lens material having the same index of refraction as the first plurality of microlenses 430 and the plurality of lens barriers 432. In one example, the second plurality of microlenses 438 has a different index of refraction than the planar layer 434 on which they are patterned. As shown in the example illustrated in FIG. 4E, each one of the second plurality of microlenses 438 is in contact with their respective lens barriers 432 within their respective second lens region.

FIG. 4F illustrates a cross-section view of the example image sensor 400 illustrated in FIG. 4E along dashed line B-B'. Accordingly, similarly named and numbered elements referenced below are coupled and function similar to as described above. As shown in the cross-section example depicted in FIG. 4F, the plurality of second microlenses 438 is arranged on the planar layer 434 in the second lens regions, which are proximate to the plurality of lens barriers 432 as shown in accordance with the teachings of the present invention. As shown, the planar layer 434 is disposed over a semiconductor substrate 436 in which a plurality of photosensitive devices 414 is arranged. In the example, each one of the plurality of second microlenses 438 is also optically coupled through the planar layer 434 to a corresponding one of the photosensitive devices 414 in the semiconductor substrate 436.

FIG. 4G illustrates a top down view of the example image sensor 400 illustrated in FIGS. 4A-F after a second reflow process, which occurs after the first reflow process in accordance with the teachings of the present invention. Accordingly, similarly named and numbered elements referenced below are coupled and function similar to as described above. In the illustrated example, the second plurality of microlenses 438 are reflowed during the second reflow process as shown. As shown in the example depicted in FIG. 4G, the second reflow process allows the surface tension in the second plurality of microlenses 438 to cause the individual pieces of the lens material of the second plurality of microlenses 438 to dome and form curvatures. As shown in the example in FIG. 4G, each one of the plurality of lens barriers 432 is arranged in a pair proximate to a defined boundary on the planar layer 434 such that each one of the pairs of lens barriers 432 provides a corresponding boundary that defines a portion of a respective second lens region on the planar layer 434 in accordance with the teachings of the present invention.

To illustrate, FIG. 4H illustrates a cross-section view of the example image sensor 400 after the second reflow process as illustrated in FIG. 4G along dashed line B-B'. Accordingly, similarly named and numbered elements referenced below are coupled and function similar to as described above. As shown in the example depicted in FIG. 4H, the second reflow process allows the surface tension in the lens material of the second plurality of microlenses 438 to dome and form curvatures. In the example, each one of the pairs of the lens barriers 432 becomes integrated with its respective microlens 438 as shown. Indeed, as discussed in one example, the lens barriers 432 are made of the same lens material and have the same index of refraction such that the lens barriers 432 become fully integrated with their respective microlens 438 after the second reflow process in accordance with the teachings of the present invention.

As shown in the example, each one of the pairs of lens barriers 432 provides a corresponding portion of a boundary such that when the second plurality of microlenses 438 is reflowed in response to the second reflow process, the plurality of lens barriers 432 prevent the lens material of a corresponding microlens 438 from merging with the lens material of a neighboring microlens 438 in accordance with the teachings of the present invention. Therefore, since the lens material of microlenses 438 is prevented from merging together by the plurality of lens barriers 432, the previously required minimum gap distances between the second plurality of microlenses 438 are no longer necessary. Accordingly, an image sensor 400 with gapless or nearly gapless microlenses is provided in accordance with the teachings of the present invention. With the gapless or nearly gapless microlenses as shown in the depicted examples, the fill factor of image sensor 400 is increased, which also improves quantum efficiency of image sensor 400 in accordance with the teachings of the present invention.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An image sensor, comprising:
   a plurality of photosensitive devices arranged in a semiconductor substrate;
   a planar layer disposed over the plurality of photosensitive devices in the semiconductor substrate;
   a plurality of first microlenses comprised of a lens material and arranged in first lens regions on the planar layer;
   a plurality of lens barriers comprised of the lens material and arranged on the planar layer to provide boundaries that define second lens regions on the planar layer; and
   a plurality of second microlenses comprised of the lens material and formed within the boundaries provided by the plurality of lens barriers that define the second lens regions on the planar layer, wherein the plurality of lens barriers are integrated within respective second microlenses after a reflow process of the plurality of second microlenses, wherein the second microlenses comprise green second lens regions, red second lens regions, and blue second lens regions.

2. The image sensor of claim 1 wherein the lens material of the plurality of first microlenses, the plurality of lens barriers, and the plurality of second microlenses are the same lens material and have the same index of refraction.

3. The image sensor of claim 1 wherein the lens material has a different index of refraction than the planar layer.

4. The image sensor of claim 1 wherein each one the plurality of first microlenses and each one of the plurality of second microlenses is optically coupled to a corresponding one of the plurality of photosensitive devices through the planar layer.

5. The image sensor of claim 1 wherein each one of the plurality of first microlenses and each one of the plurality of lens barriers includes a respective dome having a respective curvature that is formed during a first reflow process.

6. The image sensor of claim 5 wherein each one of the plurality of second microlenses includes a respective dome having a respective curvature that is formed during a second reflow process that occurs after the first reflow process, wherein the reflow process of the plurality of second microlenses occurs during the second reflow process.

7. The image sensor of claim 1 wherein the plurality of lens barriers are arranged proximate to boundaries defined between two second lens regions on the planar layer.

8. The image sensor of claim 7 wherein the plurality of lens barriers are arranged within second lens regions of a first color on the planar layer.

9. The image sensor of claim 7 wherein the plurality of lens barriers are arranged in pairs on the planar layer, where each one of the pairs of lens barriers provides a corresponding boundary proximate to a portion of a respective second lens region on the planar layer.

10. An imaging system, comprising:
    a pixel array including a plurality of photosensitive devices arranged in a semiconductor substrate;
    a planar layer disposed over the plurality of photosensitive devices in the semiconductor substrate;
    a plurality of first microlenses comprised of a lens material and arranged in first lens regions on the planar layer;
    a plurality of lens barriers comprised of the lens material and arranged on the planar layer to provide boundaries that define second lens regions on the planar layer;
    a plurality of second microlenses comprised of the lens material and formed within the boundaries provided by the plurality of lens barriers that define the second lens regions on the planar layer, wherein the plurality of lens barriers are integrated within respective second microlenses after a reflow process of the plurality of second microlenses, wherein the second microlenses comprise green second lens regions, red second lens regions, and blue second lens regions;
    control circuitry coupled to the pixel array to control operation of the pixel array; and
    readout circuitry coupled to the pixel array to readout image data from the pixel array.

11. The imaging system of claim 10 further comprising function logic coupled to the readout circuitry to store the image data readout from the pixel array.

12. The imaging system of claim 10 wherein the lens material of the plurality of first microlenses, the plurality of lens barriers, and the plurality of second microlenses are the same lens material and have the same index of refraction.

13. The imaging system of claim 10 wherein the lens material has a different index of refraction than the planar layer.

14. The imaging system of claim 10 wherein each one of the plurality of first microlenses and each one of the plurality of second microlenses is optically coupled to a corresponding one of the plurality of photosensitive devices through the planar layer.

15. The imaging system of claim 10 wherein each one of the plurality of first microlenses and each one of the plurality of lens barriers includes a respective dome having a respective curvature that is formed during a first reflow process.

16. The imaging system of claim 15 wherein each one of the plurality of second microlenses includes a respective dome having a respective curvature that is formed during a second reflow process that occurs after the first reflow process, wherein the reflow process of the plurality of second microlenses occurs during the second reflow process.

17. The imaging system of claim 10 wherein the plurality of lens barriers are arranged proximate to boundaries defined between two second lens regions on the planar layer.

18. The imaging system of claim 17 wherein the plurality of lens barriers are arranged within second lens regions of a first color on the planar layer.

19. The imaging system of claim 17 wherein the plurality of lens barriers are arranged in pairs on the planar layer, where each one of the pairs of lens barriers provides a corresponding boundary proximate to a portion of a respective second lens region on the planar layer.

\* \* \* \* \*